United States Patent
Cheng

(10) Patent No.: US 10,304,685 B2
(45) Date of Patent: May 28, 2019

(54) MANUFACTURING METHOD OF INTEGRATED CIRCUIT

(71) Applicant: UNITED MICROELECTRONICS CORP., Hsin-Chu (TW)

(72) Inventor: Chao-Sheng Cheng, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/675,811

(22) Filed: Aug. 14, 2017

(65) Prior Publication Data
US 2019/0051530 A1    Feb. 14, 2019

(51) Int. Cl.
*H01L 21/28* (2006.01)
*H01L 21/311* (2006.01)
*H01L 21/8234* (2006.01)

(52) U.S. Cl.
CPC .. *H01L 21/28141* (2013.01); *H01L 21/28017* (2013.01); *H01L 21/31144* (2013.01); *H01L 21/823437* (2013.01)

(58) Field of Classification Search
None
See application file for complete search history.

(56) References Cited

U.S. PATENT DOCUMENTS

| | | | | |
|---|---|---|---|---|
| 7,084,022 B2 * | 8/2006 | Saito | | H01L 21/28079 257/E21.202 |
| 8,093,116 B2 * | 1/2012 | Chung | | H01L 21/823842 257/E21.023 |
| 8,125,051 B2 * | 2/2012 | Chuang | | H01L 21/8249 257/511 |
| 8,372,719 B2 | 2/2013 | Wang | | |
| 8,377,763 B2 | 2/2013 | Kanike | | |
| 8,551,847 B2 * | 10/2013 | Wu | | H01L 29/66545 438/301 |
| 8,586,436 B2 * | 11/2013 | Ng | | H01L 21/823842 257/369 |
| 9,054,220 B2 * | 6/2015 | Cheek | | H01L 27/11546 |
| 9,881,927 B2 * | 1/2018 | Yeh | | H01L 27/0924 |
| 9,929,164 B2 * | 3/2018 | Cheng | | H01L 21/28273 |

(Continued)

OTHER PUBLICATIONS

Cheng, Title of Invention: Integrated Circuit and Method for Manufacturing Thereof, U.S. Appl. No. 15/232,833, filed Aug. 10, 2016.

*Primary Examiner* — David E Graybill
(74) *Attorney, Agent, or Firm* — Winston Hsu

(57) ABSTRACT

A manufacturing method of an integrated circuit includes following steps. A dummy gate with a first mask structure formed thereon and a semiconductor gate with a second mask structure formed thereon are formed on a substrate. A top surface of the semiconductor gate is lower than a top surface of the dummy gate. A first removing process is performed to remove the first mask structure and a part of the second mask structure. A dielectric layer is formed covering the dummy gate, the semiconductor gate, and the second mask structure. A second removing process is performed to remove the dielectric layer above the dummy gate. The dummy gate is removed for forming a trench. A metal gate structure is formed in the trench. The semiconductor gate is covered by the second mask structure during the second removing process and the step of removing the dummy gate.

20 Claims, 5 Drawing Sheets

(56) References Cited

U.S. PATENT DOCUMENTS

| | | | |
|---|---|---|---|
| 10,056,397 B2* | 8/2018 | Cheng | H01L 21/28273 |
| 2005/0127460 A1* | 6/2005 | Saito | H01L 21/28079 |
| | | | 257/412 |
| 2010/0001369 A1* | 1/2010 | Chuang | H01L 21/8249 |
| | | | 257/526 |
| 2010/0087038 A1* | 4/2010 | Chung | H01L 21/823842 |
| | | | 438/199 |
| 2011/0223753 A1* | 9/2011 | Wang | H01L 21/28017 |
| | | | 438/585 |
| 2012/0139049 A1* | 6/2012 | Kanike | H01L 27/0629 |
| | | | 257/350 |
| 2012/0244675 A1* | 9/2012 | Wu | H01L 29/66545 |
| | | | 438/301 |
| 2013/0249010 A1* | 9/2013 | Ng | H01L 21/823842 |
| | | | 257/369 |
| 2014/0225176 A1 | 8/2014 | Cheek | |
| 2015/0311295 A1* | 10/2015 | Lee | H01L 29/407 |
| | | | 257/331 |
| 2015/0325647 A1 | 11/2015 | Kanike | |
| 2016/0056162 A1 | 2/2016 | Yeh | |
| 2018/0012899 A1* | 1/2018 | Cheng | H01L 21/28273 |
| 2018/0166455 A1* | 6/2018 | Cheng | H01L 21/28273 |

\* cited by examiner

MANUFACTURING METHOD OF INTEGRATED CIRCUIT

BACKGROUND OF THE INVENTION

1. Field of the Invention

The present invention relates to a manufacturing method of an integrated circuit, and more particularly, to a manufacturing method of an integrated circuit including a semiconductor gate and a metal gate structure.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly.

Polysilicon is conventionally used as a gate electrode in semiconductor devices, such as the metal-oxide-semiconductor (MOS). With the trend towards scaling down the size of semiconductor devices, however, conventional polysilicon gates face problems such as inferior performance due to boron penetration and unavoidable depletion effects. This increases equivalent thickness of the gate dielectric layer, reduces gate capacitance and worsens a driving force of the devices. Therefore, work function metals that are suitable for use as the high-k gate dielectric layer are used to replace the conventional polysilicon gate to be the control electrode. However, other kinds of semiconductor devices including polysilicon gates, such as semiconductor memory devices and transistors having different conductivity types and/or different threshold voltages are still required in integrated circuits, and gate structures of these devices may be different from one another for different functions. Accordingly, for the related industries, it is important to integrate manufacturing processes of these gate structures more efficiently.

SUMMARY OF THE INVENTION

A manufacturing method of an integrated circuit is provided by the present invention. A mask structure covering a semiconductor gate during a replacement metal gate process is formed corresponding to the semiconductor gate and formed before a step of exposing a dummy gate used in the replacement metal gate process. Problems such as gate height loss of a metal gate structure and residues of metal materials may be avoided accordingly.

A manufacturing method of an integrated circuit includes the following steps. A substrate including a first region and a second region defined thereon is provided. A dummy gate is formed on the first region of the substrate and a first mask structure is formed on the dummy gate. A semiconductor gate is formed on the second region of the substrate and a second mask structure is formed on the semiconductor gate. A top surface of the semiconductor gate is lower than a top surface of the dummy gate in a thickness direction of the substrate. A first removing process is performed to remove the first mask structure and a part of the second mask structure. A dielectric layer is formed covering the dummy gate, the semiconductor gate, the second mask structure, and the substrate after the first removing process. A second removing process is performed to remove the dielectric layer above the dummy gate and expose the dummy gate. The dummy gate is removed after the second removing process for forming a trench on the substrate, and a metal gate structure is formed in the trench. The semiconductor gate is covered by the second mask structure during the second removing process and the step of removing the dummy gate.

In the manufacturing method of the integrated circuit according to the present invention, a part of the second mask structure remains on the semiconductor gate after the step of removing the first mask structure on the dummy gate, and the second mask structure covers the semiconductor gate during the step of exposing the dummy gate and the step of removing the dummy gate for protecting the semiconductor gate. Problems caused by patterning a mask layer after the step of exposing the dummy gate, such as gate height loss issue and metal material residue issue, may be avoided accordingly.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-9 are schematic drawings illustrating a manufacturing method of an integrated circuit according to an embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, and FIG. 9 is a schematic drawing in a step subsequent to FIG. 8.

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Figure 1:
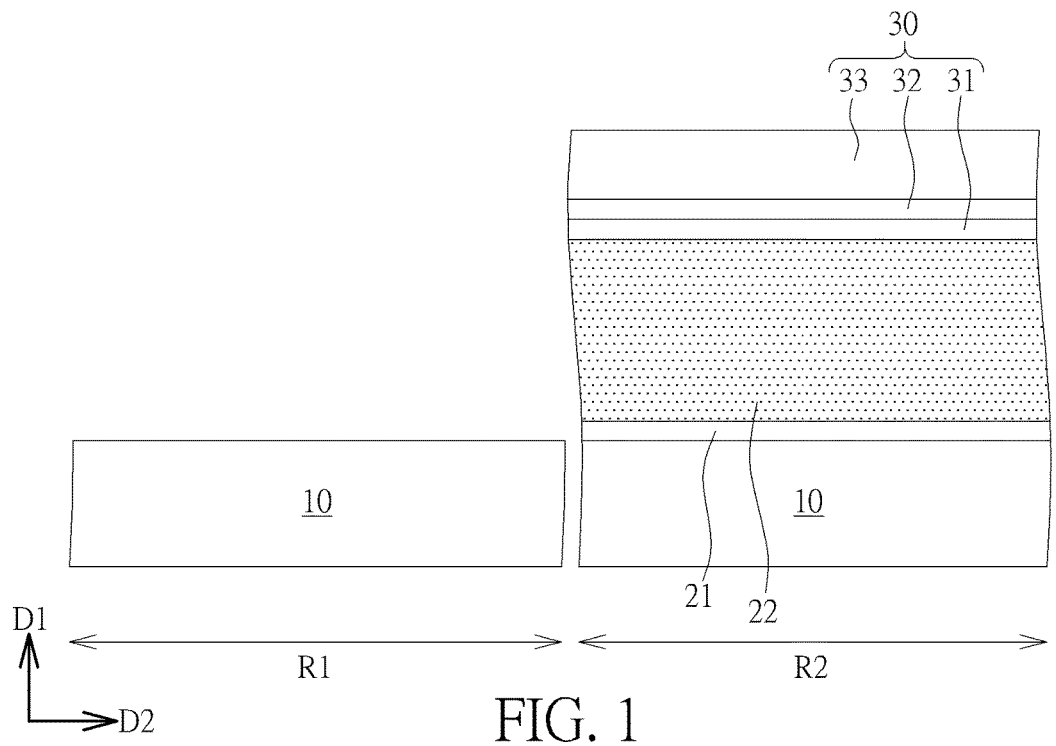

Please refer to FIGS. 1-9. FIGS. 1-9 are schematic drawings illustrating a manufacturing method of an integrated circuit according to an embodiment of the present invention. The manufacturing method in this embodiment may include the following steps. As shown in FIG. 1, a substrate 10 including a first region R1 and a second region R2 defined thereon is provided. The substrate 10 may include a semiconductor substrate such as a silicon substrate, an epitaxial substrate, a silicon carbide substrate, or a silicon-on-insulator (SOI) substrate, but not limited thereto. A gate material layer 22 may be formed on the second region R2 of the substrate 10, and a mask material layer 30 may be formed on the gate material layer 22. In some embodiments, the gate material layer 22 may include a semiconductor layer such as a polysilicon layer or other suitable gate materials. The gate material layer 22 may be patterned to be a semiconductor gate in the subsequent processes, and the mask material layer 30 may be patterned to be a mask structure on the semiconductor gate, but not limited thereto. In some embodiments, the mask material layer 30 may be a multi-layer structure including different material layers. For example, the mask material layer 30 may include a first oxide layer 31, a first nitride layer 32, and a second oxide layer 33 sequentially formed on the gate material layer 20 in a thickness direction of the substrate 10 (such as a first direction D1 shown in FIG. 1). In other words, the first nitride layer 32 is formed on the first oxide layer 31, the second oxide layer 33 is formed on the first nitride layer 32, and the first nitride layer 32 is located between the first oxide layer 31 and the second oxide layer 33 in the thickness direction of the substrate 10. The mask material layer 30 may include an oxide-nitride-oxide (ONO) multi-layer structure, but not limited thereto. In some embodiments of the present invention, the mask material layer 30 may also be composed of other materials and/or other combinations of material layers. In some embodiments, a first gate dielectric layer 21 may be formed on the second region R2 of the substrate 10 before the step of forming the gate material layer 22, but not limited thereto. The first gate dielectric layer 21 may include silicon oxide or other suitable dielectric materials.

Figure 2:
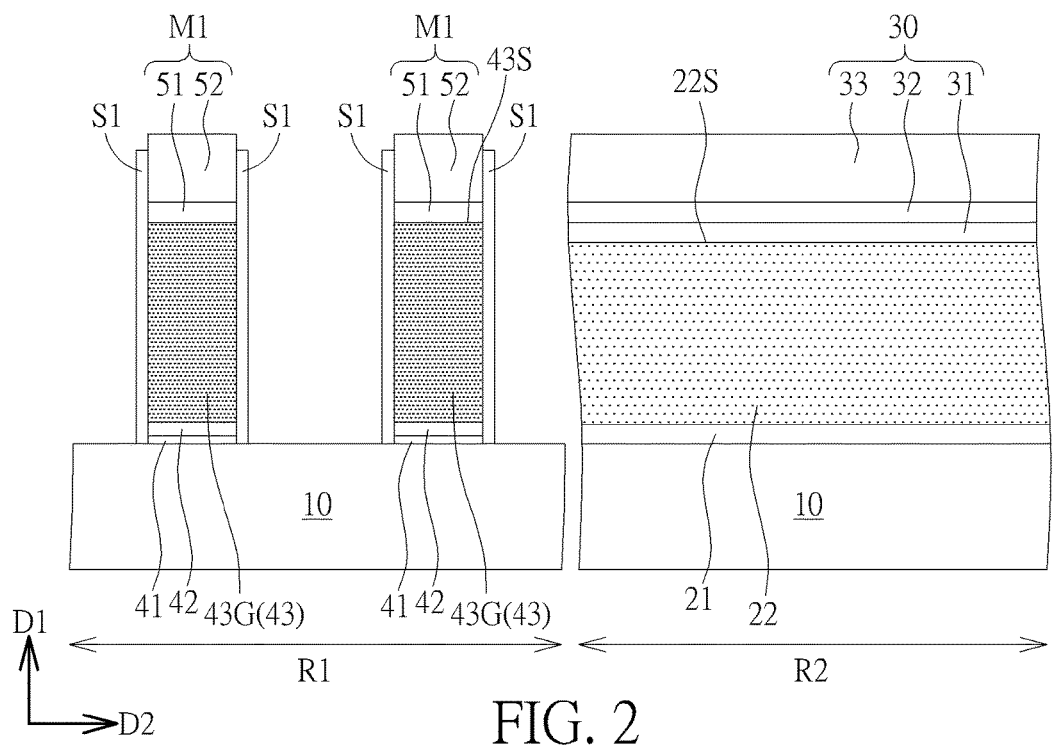

As shown in FIG. 2, a dummy gate 43G may be formed on the first region R1 of the substrate 10 and a first mask structure M1 may be formed on the dummy gate 43G. In other words, the gate material layer 22 and the mask material layer 30 may be formed before the step of forming the dummy gate 43G and the step of forming the first mask structure M1, but not limited thereto. In some embodiments of the present invention, the gate material layer 22 and the mask material layer 30 may also be formed after the steps of forming the dummy gate 43G and the first mask structure M1 according to other considerations. In some embodiments, a dummy gate material layer 43 may be formed on the substrate 10, and the dummy gate material layer 43 may be patterned to be a plurality of the dummy gates 43G on the substrate 10. The dummy gate material layer 43 may include polysilicon, amorphous silicon, or other suitable materials. In some embodiments, the first mask structure M1 may be formed by patterning a mask material layer formed on the dummy gate material layer 43, but not limited thereto. For example, a second nitride layer 51 and a third oxide layer 52 may be sequentially formed on the dummy gate material layer 43, and the second nitride layer 51 and the third oxide layer 52 may be patterned to become the first mask structure M1, but not limited thereto. In other words, the first mask structure M1 may include the second nitride layer 51 and the third oxide layer 52 formed on the second nitride layer 51, and the second nitride layer 51 is located between the third oxide layer 52 and the dummy gate 43G in the thickness direction of the substrate 10. In some embodiments, an interfacial layer 41 and a second gate dielectric layer 42 may be formed on the substrate 10 before the step of forming the dummy gate material layer 43, but not limited thereto. The interfacial layer 41 may include an oxide layer, and the second gate dielectric layer 42 may include high dielectric constant (high-k) materials, such as hafnium oxide ($HfO_2$), hafnium silicon oxide ($HfSiO_4$), hafnium silicon oxynitride (HfSiON), aluminum oxide ($Al_2O_3$), tantalum oxide ($Ta_2O_5$), and zirconium oxide ($ZrO_2$), but not limited thereto. Additionally, in some embodiments, the second gate dielectric layer 42, the dummy gate material layer 43, the second nitride layer 51, and the third oxide layer 52 may be patterned by a photolithographic process, but not limited thereto. In some embodiments, the first mask structure M1 may be formed by a photolithographic process, and the dummy gate material layer 43 and the second gate dielectric layer 42 may be patterned by an etching process using the first mask structure M1 as an etching mask. In other words, a projection area of the first mask structure M1 in the first direction D1 may be substantially the same as a projection area of the dummy gate 43G in the first direction D1, but not limited thereto. The second gate dielectric layer 42 may be formed between the dummy gate 43G and the substrate 10. In addition, a first spacer S1 may be formed on a sidewall of the dummy gate 43G and a sidewall of the first mask structure M1 in a horizontal direction (such as a second direction D2 shown in FIG. 2). The first spacer 51 may be formed after the steps of forming the dummy gate 43G and the first mask structure M1, and the first spacer S1 may include silicon nitride or other suitable insulation materials. The first spacer S1 may be used as a mask for forming lightly doped regions (not shown) in the substrate 10, but not limited thereto.

Figure 3:
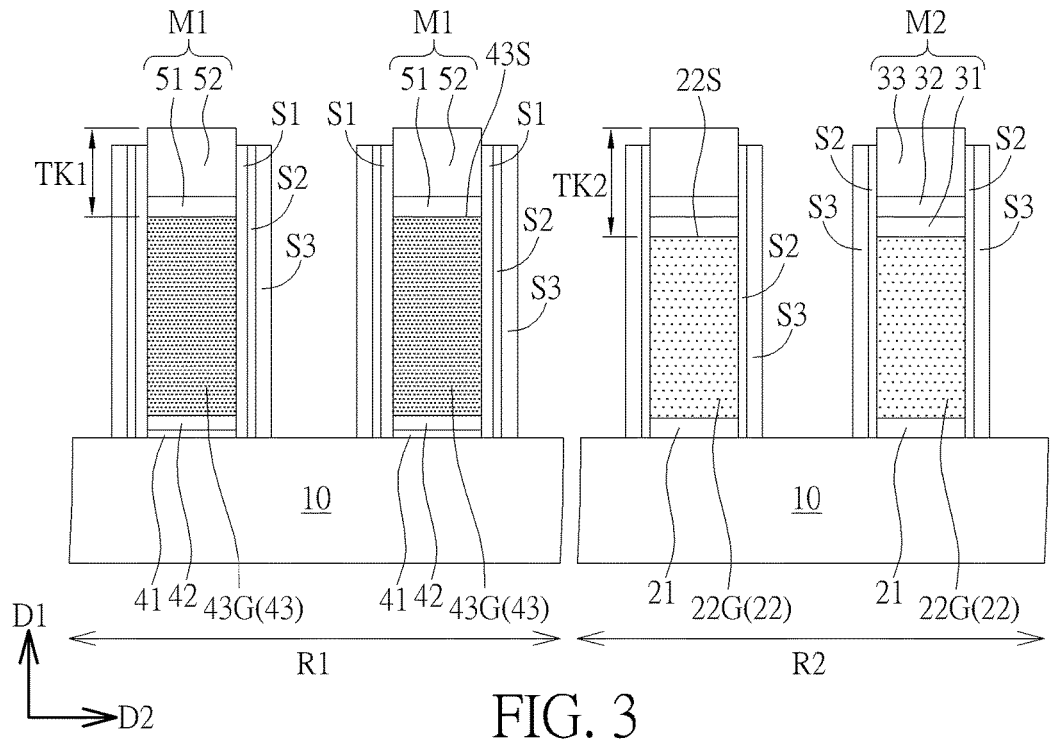

As shown in FIG. 2 and FIG. 3, the gate material layer 22 is patterned for forming semiconductor gates 22G on the second region R2 of the substrate 10, and the mask material layer 30 is patterned for forming second mask structures M2 on the semiconductor gates 22G. In some embodiments, the first gate dielectric layer 21, the gate material layer 22, and the mask material layer 30 may be patterned by a photolithographic process, but not limited thereto. In some embodiments, the second mask structure M2 may be formed by a photolithographic process, and the gate material layer 22 and the first gate dielectric layer 21 may be patterned by an etching process using the second mask structure M2 as an etching mask. In other words, a projection area of the second mask structure M2 in the first direction D1 may be substantially the same as a projection area of the semiconductor gate 22G in the first direction D1, but not limited thereto. The first gate dielectric layer 21 may be formed between the semiconductor gate 22G and the substrate 10. The dummy gates 43G and the first mask structures M1 may be covered by a protection layer (not shown) such as a photoresist layer during the process of patterning the mask material layer 30 and the gate material layer 22, but not limited thereto. In other words, the dummy gates 43G, the first mask structures M1, and the first spacer S1 may be formed before the step of forming the semiconductor gates 22G and the step of forming the second mask structures M2, but not limited thereto. In some embodiments of the present invention, the semiconductor gates 22G and the second mask structures M2 may also be formed before the steps of forming the dummy gates 43G, the first mask structures M1, and the first spacer S1 according to other considerations. Additionally, in some embodiments, the first region R1 may include a core region and the second region R2 may include a memory region, and the semiconductor gate 22G may include a gate structure of a memory device, such as a control gate or a select gate of a memory device, but not limited thereto. In some embodiments, the first region R1 and the second region R2 may be regions for transistors having different threshold voltages, and a thickness of the first gate dielectric layer 21 may be different from a thickness of the second gate dielectric layer 42. For example, the semiconductor gate 22G may include a gate structure of a high voltage (HV) semiconductor device, and the first gate dielectric layer 21 may be thicker than the second gate dielectric layer 42, but not limited thereto.

In addition, the composition of the second mask structure M2 may be different from the composition of the first mask structure M1, but not limited thereto. For example, the first mask structure M1 may be composed of the second nitride layer 51 and the third oxide layer 52, and the second mask structure M2 may be composed of the first oxide layer 31, the first nitride layer 32, and the second oxide layer 33. In some embodiments, a thickness of the second mask structure M2 (such as a second thickness TK2 shown in FIG. 3) may be larger than a thickness of the first mask structure M1 (such as a first thickness TK1 shown in FIG. 3). The topmost surface of the first mask structure M1 and the topmost surface of the second mask structure M2 may be substantially located at the same level in the first direction D1, the first mask structure M1 may directly contact the dummy gate 43G, and the second mask structure M2 may directly contact the semiconductor gate 22G, but not limited thereto. Therefore, a top surface of the semiconductor gate 22G (such as a first topmost surface 22S shown in FIG. 3) may be lower than a top surface of the dummy gate 43G (such as a second topmost surface 43S shown in FIG. 3) in the thickness direction of the substrate 10. In some embodiments, the material and the thickness of the first nitride layer 32 may be substantially the same as those of the second nitride layer 51, and the material and the thickness of the second oxide layer 33 may be substantially the same as those of the third oxide layer 52, but not limited thereto.

As shown in FIG. 3, a second spacer S2 may be formed on a sidewall of the semiconductor gate 22G and a sidewall of the second mask structure M2, and a third spacer S3 may be formed on the second spacer S2, but not limited thereto. In some embodiments, the second spacer S2 and the third spacer S3 may be further formed on the first spacer S1, and the second spacer S2 and the third spacer S3 may be formed after the step of forming the first spacer S1, but not limited thereto. In some embodiments, the second spacer S2 and/or the third spacer S3 may be used as a mask in a process of forming source/drain regions (not shown) in the substrate 10, but not limited thereto. The material of the second spacer S2 may be different from the material of the first spacer S1 and the material of the third spacer S3. For example, the second spacer S2 may include silicon oxide or other suitable insulation materials, and the third spacer S3 may include silicon nitride or other suitable insulation materials.

Figure 4:
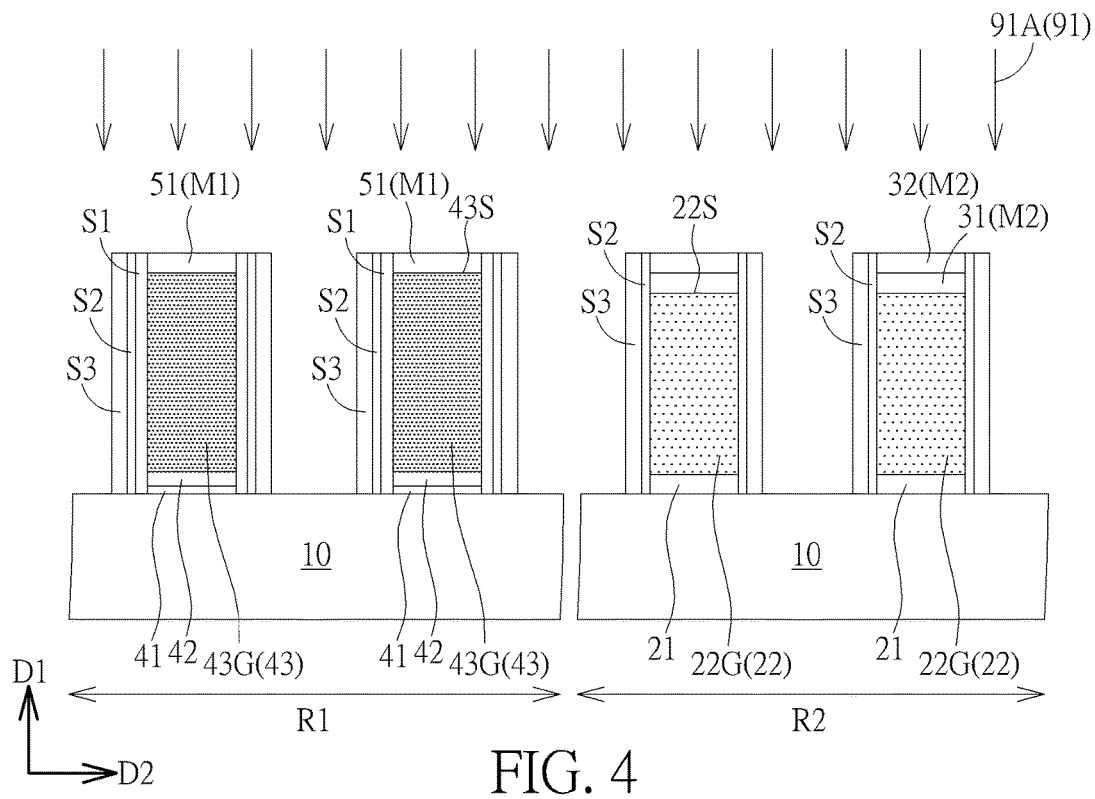
Figure 5:
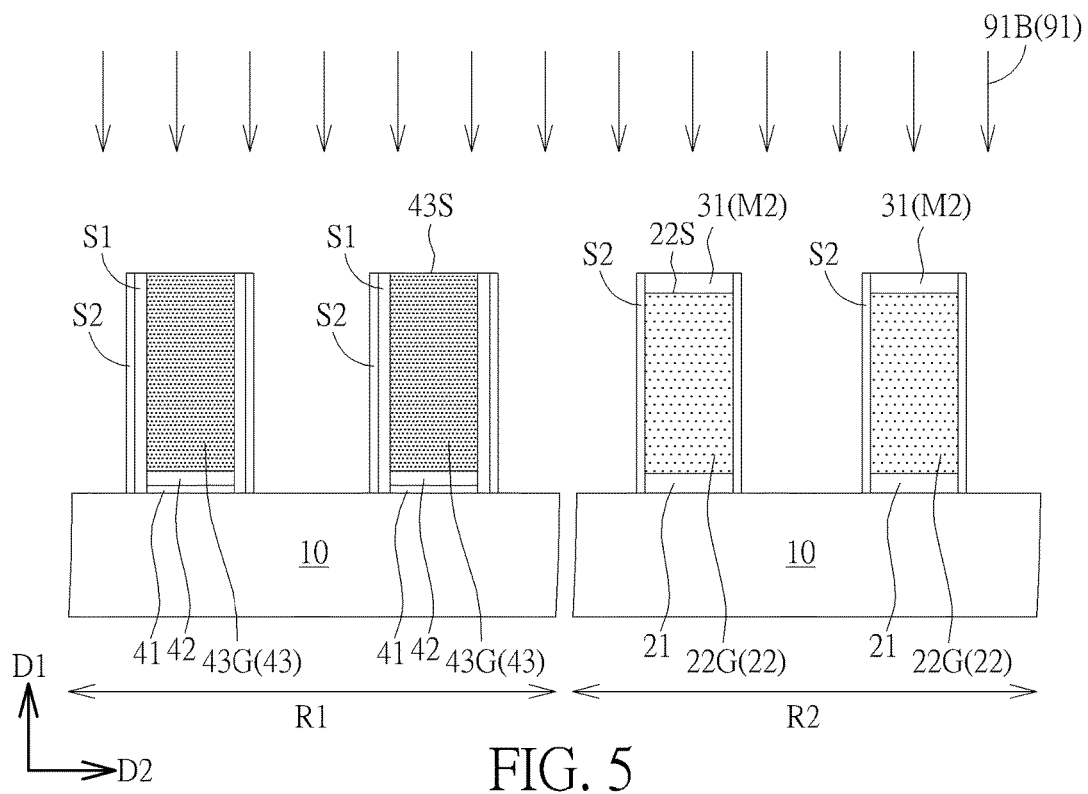

As shown in FIGS. 3-5, a first removing process 91 may be performed to remove the first mask structure M1 and a part of the second mask structure M2. The second topmost surface 43S of the dummy gate 43G may be exposed after the first removing process 91, but not limited thereto. Accordingly, the second spacer S2 and the third spacer S3 may be formed before the first removing process 91. The first mask structure M1 may be totally removed by the first removing process 91, the second oxide layer 33 and the first nitride layer 32 of the second mask structure M2 may be totally removed by the first removing process 91, and the first oxide layer 31 may cover the semiconductor gate 22G during and after the first removing process 91. Specifically, in some embodiments, the first removing process 91 may include a plurality of steps, and each step may be used to remove a specific material layer. For example, the first removing process 91 may include a first step 91A and a second step 91B performed after the first step 91A, and the process condition of the second step 91B may be different from that of the first step 91A. In some embodiments, the first step 91A may be configured to remove oxide, such as the second oxide layer 33 of the second mask structure M2 and the third oxide layer 52 of the first mask structure M1, and the second step 91B may be configured to remove nitride, such as the first nitride layer 32 of the second mask structure M2 and the second nitride layer 51 of the first mask structure M1 for exposing the dummy gate 43G, but not limited thereto. The first step 91A and the second step 91B may be etching processes with different process conditions. In some embodiments, a part of the first spacer S1, a part of the second spacer S2, and a part of the third spacer S3 may be removed by the first step 91A of the first removing process 91, and the third spacer S3 may be totally removed by the second step 91B of the first removing process 91, but not limited thereto.

Figure 6:
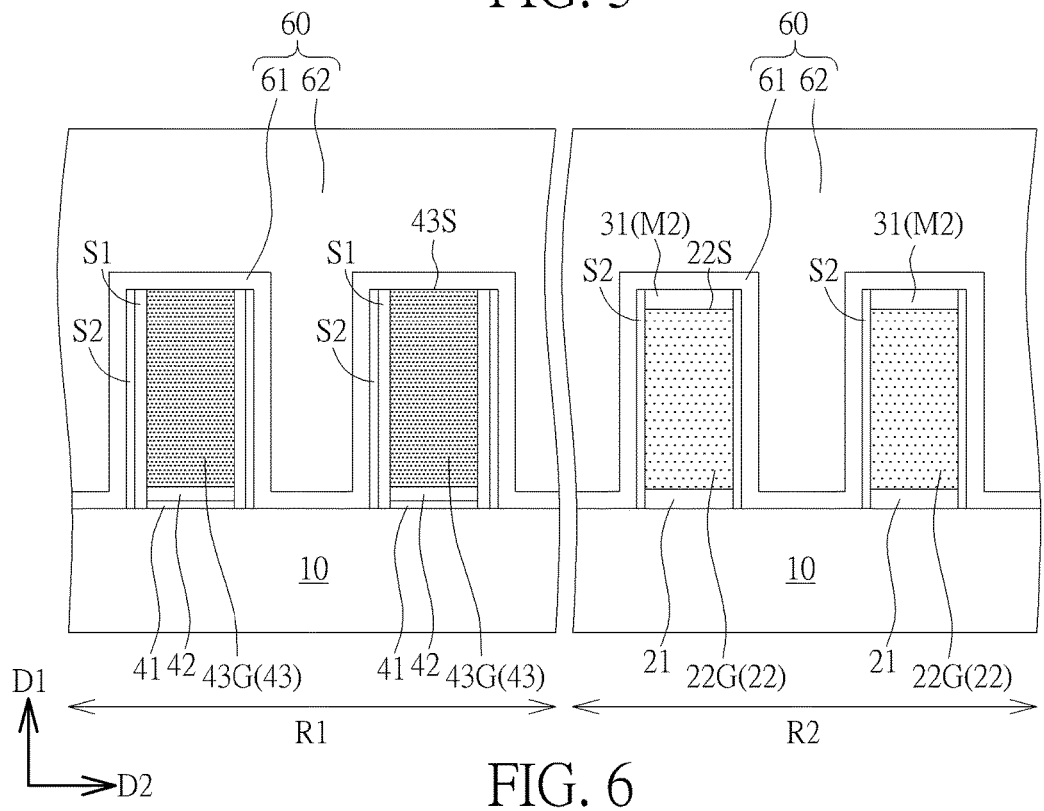
Figure 7:
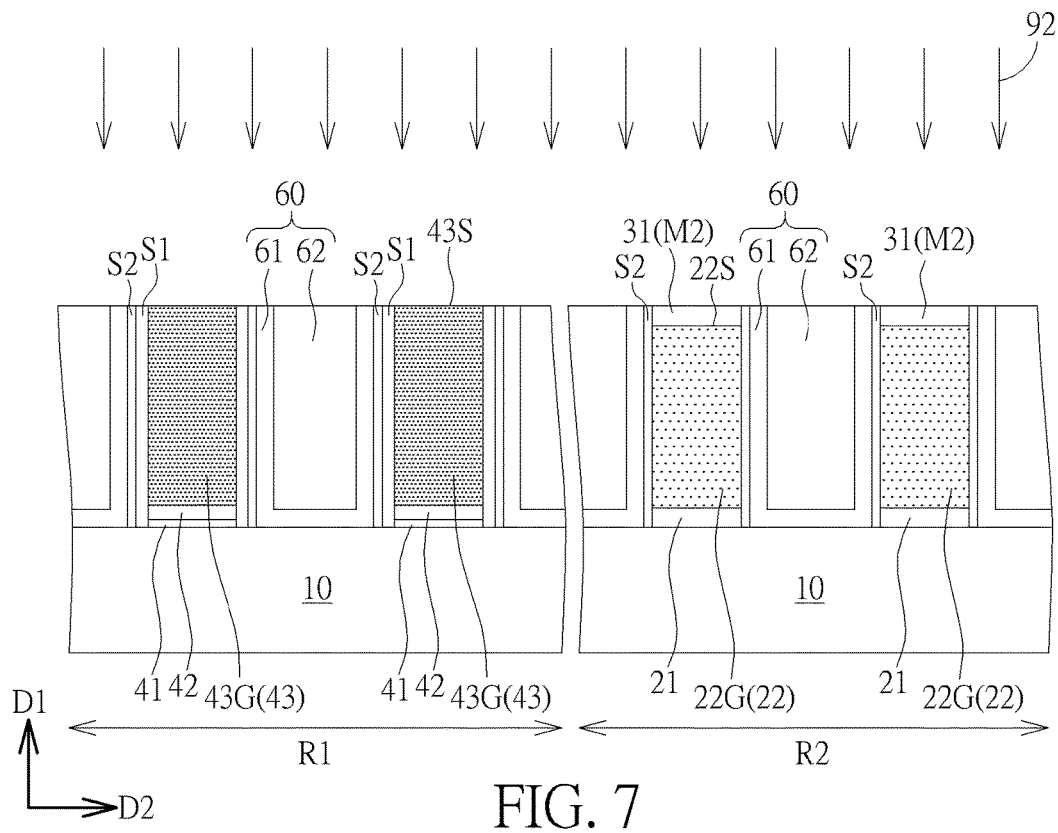

As shown in FIG. 5 and FIG. 6, a dielectric layer 60 is then formed and covers the dummy gates 43G, the semiconductor gates 22G, the second mask structures M2, the first spacer S1, the second spacer S2, and the substrate 10 after the first removing process 91. The dielectric layer 60 may be a single layer structure or a multiple layer structure. For example, in some embodiments, the dielectric layer 60 may include an etching stop layer 61 and an interlayer dielectric 62. The etching stop layer 61 may be conformally formed on the dummy gates 43G, the semiconductor gates 22G, the second mask structures M2, the first spacer S1, the second spacer S2, and the substrate 10. The interlayer dielectric 62 may be formed on the etching stop layer 61. The etching stop layer 61 may include silicon nitride or other suitable insulation materials, and the interlayer dielectric 62 may include silicon oxide or other suitable insulation materials. As shown in FIG. 6 and FIG. 7, a second removing process 92 may be performed to remove the dielectric layer 60 above the dummy gates 43G and expose the dummy gates 43. The second removing process 92 may include an etching back process, a planarization process, such as a chemical mechanical polishing (CMP) process, or other suitable removing process. Because the first topmost surface 22S of the semiconductor gate 22G is lower than the second topmost surface 43S of the dummy gate 43G in the first direction D1, the first oxide layer 31 of the second mask structure M2 may protect the semiconductor gate 22G from being damaged by the second removing process 92. In other words, the semiconductor gate 22G may be covered by the first oxide layer 31 of the second mask structure M2 during the second removing process 92. It is worth noting that the height of the dummy gate 43G and the height of a metal gate structure formed in the subsequent process will not be influenced by the step of forming the second mask structure M2 because the second mask structure M2 is defined before the step of forming the dielectric layer 60 and the step of exposing the dummy gates 43G.

Figure 8:
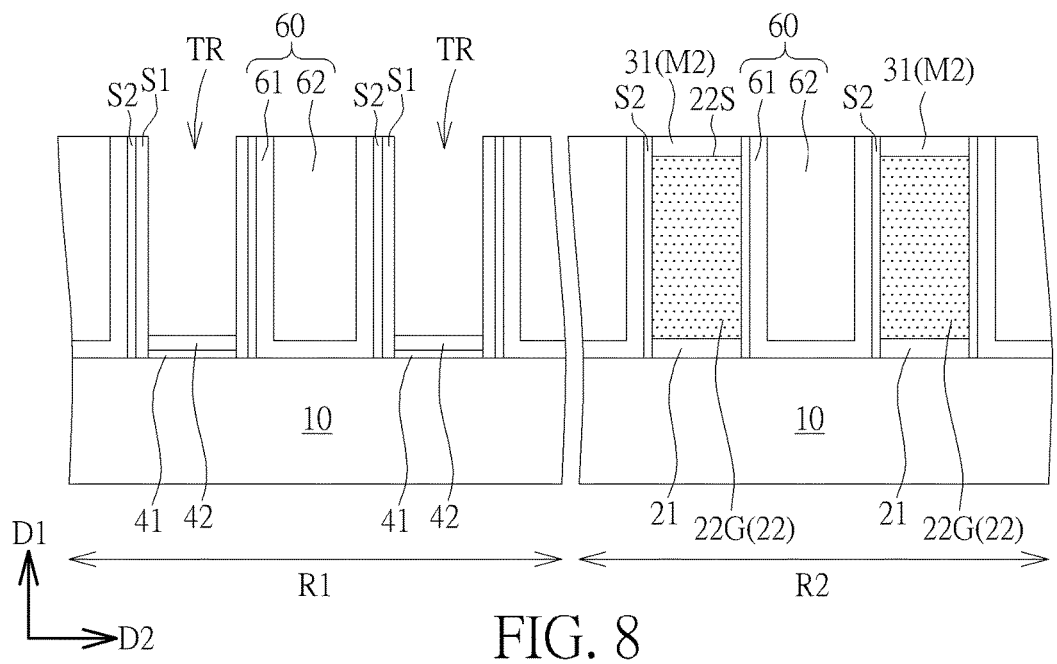
Figure 9:
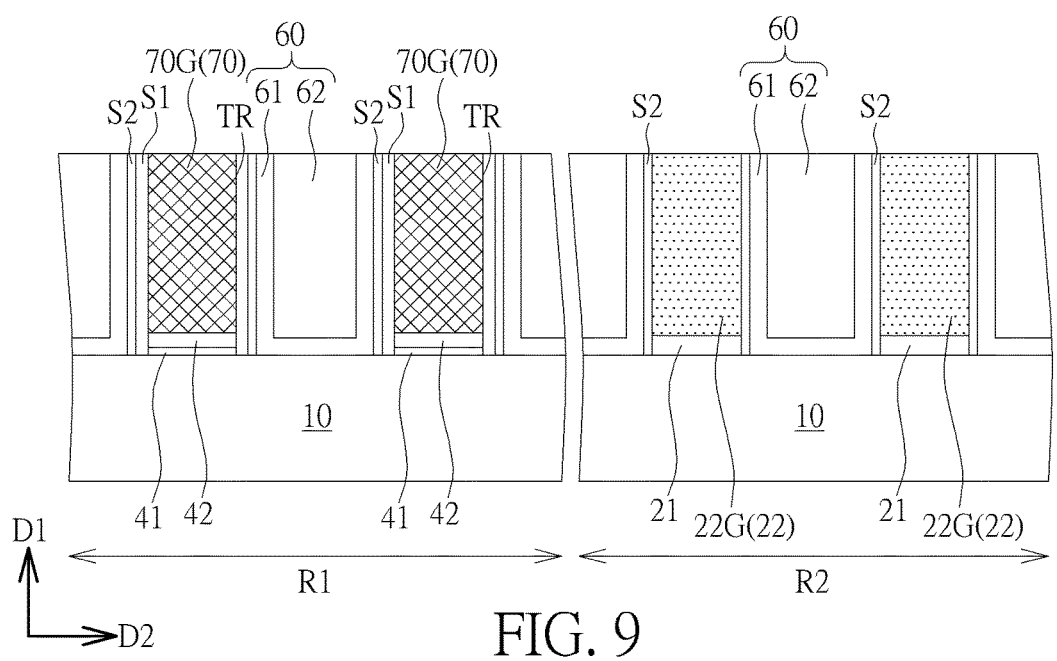

As shown in FIG. 7 and FIG. 8, the dummy gates 43G are removed after the second removing process 92 for forming trenches TR on the substrate 10. Each of the trenches TR may be surrounded by the first spacer S1, the second spacer S2, and the dielectric layer 60. The semiconductor gate 22G may be covered by the first oxide layer 31 of the second mask structure M2 during the second removing process 92 and the step of removing the dummy gates 43G. As shown in FIG. 8 and FIG. 9, a metal gate structure 70G may then be formed in the trench TR. Specifically, a metal gate material layer 70 may be formed in the trenches TR and on the dielectric layer 60, and another planarization process may be performed to remove the metal gate material layer 70 outside the trenches TR and the first oxide layer 31 of the second mask structure M2 for exposing the semiconductor gates 22G, but not limited thereto. It is worth noting that the problem of metal material residue on the dielectric layer 60 after the planarization process for removing the metal gate material layer 70 outside the trenches TR may be avoided because the topmost surface of the dielectric layer 60 in the first region R1 and the topmost surface of the dielectric layer 60 in the second region R2 may be substantially coplanar after the second removing process 92 and the step of removing the dummy gates 43G. In some embodiments, the metal gate material layer 70 may be a multiple layer structure including one or more work function layers (not shown) and a low resistivity layer (not shown) disposed on the work function layer, but not limited thereto. The method of forming the metal gate structure 70G in the present invention may be regarded as a replacement metal gate (RMG) process, but not limited thereto. In some embodiments, the metal gate structure 70G may be a gate structure of a transistor in the core region, and the semiconductor gate 22G may be a gate structure of a HV transistor, but not limited thereto. In some embodiment of the present invention, the semiconductor gate 22G may also be a gate structure of a memory device, such as a control gate or a select gate of a memory device. It is worth noting that in some embodiments, the second gate dielectric layer 42 may be formed before the step of forming the trenches TR by removing the dummy gates mentioned above, and it may be regarded as a high-k first process, but not limited thereto. However, in some embodiments of the present invention, the second gate dielectric layer 42 may be formed after the step of forming the trenches TR and before the step of forming the metal gate structure 70G, and this may be regarded as a high-k last process.

To summarize the above descriptions, in the manufacturing method of the integrated circuit in the present invention, the first mask structure on the dummy gate and the second mask structure on the semiconductor gate are formed by different processes. The top surface of the semiconductor gate is lower than the top surface of the dummy gate, and the composition of the first mask structure is different from the composition of the second mask structure. Therefore, the second mask structure may cover the semiconductor gate during the replacement metal gate process for protecting the semiconductor gate. The second mask structure may be formed before the step of exposing the dummy gate for avoiding problems caused by patterning a mask layer after the step of exposing the dummy gate. Accordingly, the gate height loss issue and the metal material residue issue may be avoided by the manufacturing method of the present invention, and the related manufacturing yield and product performance may be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of an integrated circuit, comprising:
   providing a substrate comprising a first region and a second region defined thereon;
   forming a dummy gate on the first region of the substrate and a first mask structure on the dummy gate;
   forming a semiconductor gate on the second region of the substrate and a second mask structure on the semiconductor gate, wherein a top surface of the semiconductor gate is lower than a top surface of the dummy gate in a thickness direction of the substrate;
   performing a first removing process to remove the first mask structure and a part of the second mask structure;
   forming a dielectric layer covering the dummy gate, the semiconductor gate, the second mask structure, and the substrate after the first removing process;
   performing a second removing process to remove the dielectric layer above the dummy gate and expose the dummy gate;
   removing the dummy gate after the second removing process for forming a trench on the substrate, wherein the semiconductor gate is covered by the second mask structure during the second removing process and the step of removing the dummy gate; and
   forming a metal gate structure in the trench.

2. The manufacturing method of the integrated circuit according to claim 1, wherein the composition of the second mask structure is different the composition of the first mask structure.

3. The manufacturing method of the integrated circuit according to claim 1, wherein a thickness of the second mask structure is larger than a thickness of the first mask structure.

4. The manufacturing method of the integrated circuit according to claim 1, wherein the second mask structure comprises:
   a first oxide layer;
   a first nitride layer formed on the first oxide layer; and
   a second oxide layer formed on the first nitride layer, wherein the first nitride layer is located between the first oxide layer and the second oxide layer in the thickness direction of the substrate.

5. The manufacturing method of the integrated circuit according to claim 4, wherein the second oxide layer and the first nitride layer are removed by the first removing process, and the first oxide layer covers the semiconductor gate during the second removing process and the step of removing the dummy gate.

6. The manufacturing method of the integrated circuit according to claim 4, wherein the first mask structure comprises:
   a second nitride layer; and
   a third oxide layer formed on the second nitride layer, wherein the second nitride layer is located between the third oxide layer and the dummy gate in the thickness direction of the substrate.

7. The manufacturing method of the integrated circuit according to claim 6, wherein the first removing process comprises:
   a first step configured to remove the second oxide layer of the second mask structure and the third oxide layer of the first mask structure; and
   a second step configured to remove the first nitride layer of the second mask structure and the second nitride layer of the first mask structure for exposing the dummy gate.

8. The manufacturing method of the integrated circuit according to claim 1, wherein the dummy gate and the first mask structure are formed before the step of forming the semiconductor gate and the step of forming the second mask structure.

9. The manufacturing method of the integrated circuit according to claim 8, further comprising:
   forming a first spacer on a sidewall of the dummy gate and a sidewall of the first mask structure before the step of forming the semiconductor gate and the step of forming the second mask structure.

10. The manufacturing method of the integrated circuit according to claim 9, further comprising:
    forming a second spacer on a sidewall of the semiconductor gate and a sidewall of the second mask structure after the step of forming the first spacer and before the first removing process.

11. The manufacturing method of the integrated circuit according to claim 8, wherein the steps of forming the semiconductor gate and the second mask structure comprise:
    forming a gate material layer on the second region of the substrate;
    forming a mask material layer on the gate material layer; and
    patterning the mask material layer for forming the second mask structure; and
    patterning the gate material layer for forming the semiconductor gate.

12. The manufacturing method of the integrated circuit according to claim 11, wherein the gate material layer and the mask material layer are formed before the step of forming the dummy gate and the step of forming the first mask structure.

13. The manufacturing method of the integrated circuit according to claim 11, wherein the gate material layer comprises polysilicon.

14. The manufacturing method of the integrated circuit according to claim 11, wherein the mask material layer comprises an oxide-nitride-oxide multi-layer structure.

15. The manufacturing method of the integrated circuit according to claim 1, further comprising:
    forming a first gate dielectric layer between the semiconductor gate and the substrate; and
    forming a second gate dielectric layer between the dummy gate and the substrate.

16. The manufacturing method of the integrated circuit according to claim 15, wherein a thickness of the first gate dielectric layer is different from a thickness of the second gate dielectric layer.

17. The manufacturing method of the integrated circuit according to claim 1, wherein the dielectric layer comprises:
    an etching stop layer conformally formed on the dummy gate, the semiconductor gate, the second mask structure, and the substrate; and
    an interlayer dielectric formed on the etching stop layer.

18. The manufacturing method of the integrated circuit according to claim 1, wherein the first region comprises a core region and the second region comprises a memory region.

19. The manufacturing method of the integrated circuit according to claim 1, wherein the semiconductor gate comprises a gate structure of a memory device.

20. The manufacturing method of the integrated circuit according to claim 1, wherein the semiconductor gate comprises a gate structure of a high voltage semiconductor device.

* * * * *